(12) United States Patent
Shimoyama

(10) Patent No.: US 6,594,189 B2
(45) Date of Patent: Jul. 15, 2003

(54) INFORMATION STORAGE APPARATUS, INFORMATION STORAGE METHOD, RECORDING MEDIUM AND PROGRAM

(75) Inventor: Takeshi Shimoyama, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/151,853

(22) Filed: May 22, 2002

(65) Prior Publication Data

US 2002/0181308 A1 Dec. 5, 2002

(30) Foreign Application Priority Data

May 25, 2001 (JP) ........................................ 2001-156737

(51) Int. Cl.$^7$ ................................................ G11C 7/00
(52) U.S. Cl. ........................ 365/203; 365/222; 365/227
(58) Field of Search ................................. 365/203, 222, 365/227

(56) References Cited

U.S. PATENT DOCUMENTS

| | | | | |
|---|---|---|---|---|
| 5,629,898 A | * | 5/1997 | Idei et al. ................... 365/222 |
| 5,802,555 A | * | 9/1998 | Shigeeda ..................... 711/106 |
| 5,873,114 A | * | 2/1999 | Rahman et al. ............. 711/106 |
| 6,137,743 A | * | 10/2000 | Kim .............................. 365/222 |
| 6,313,844 B1 | * | 11/2001 | Yamashita ................... 345/531 |
| 6,483,764 B2 | * | 11/2002 | Chen Hsu et al. .......... 365/222 |

* cited by examiner

Primary Examiner—Michael S. Lebentritt
Assistant Examiner—Tuan T. Nguyen
(74) Attorney, Agent, or Firm—Oblon, Spivak, McClelland, Maier & Neustadt, P.C.

(57) ABSTRACT

A self refresh timing generator detects the presence/absence of a read signal output by a control signal generator employed in a DRAM controller to a memory bank and, if no read signal is detected in a predetermined period of time, a refresh signal is generated and output to a refresh suppression register, which has been set in on or off status by the control signal generator in advance. If the refresh suppression register has been set in on status, the refresh signal is blocked and thus not output to the memory bank in the DRAM. If the refresh suppression register has been set in set in off status, on the other hand, the refresh suppression register passes on the refresh signal to the predetermined page of the memory bank associated with the refresh suppression register. As a result, the power consumption of the DRAM is reduced and a high speed read operation can be implemented with a high degree of probability.

14 Claims, 7 Drawing Sheets

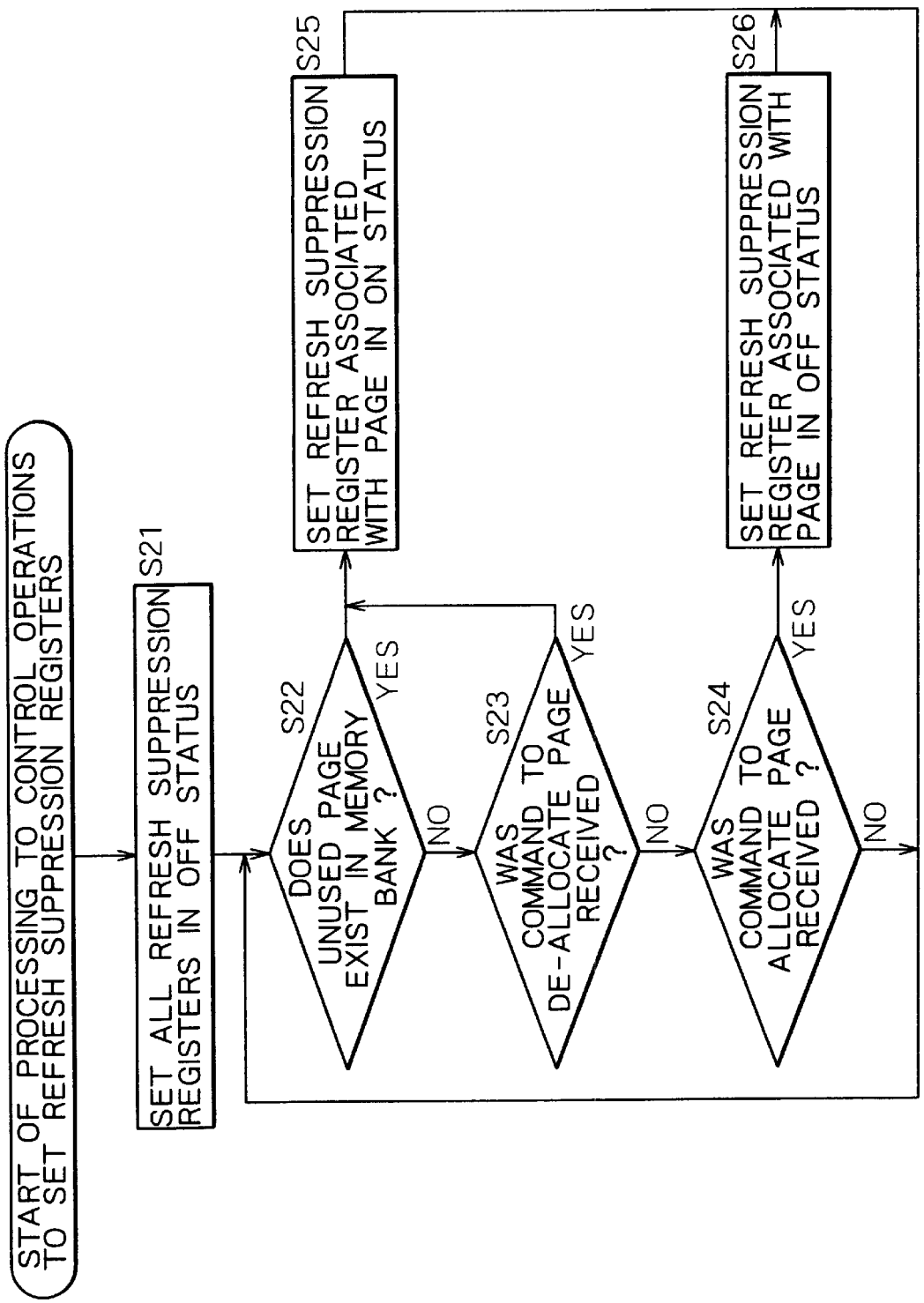

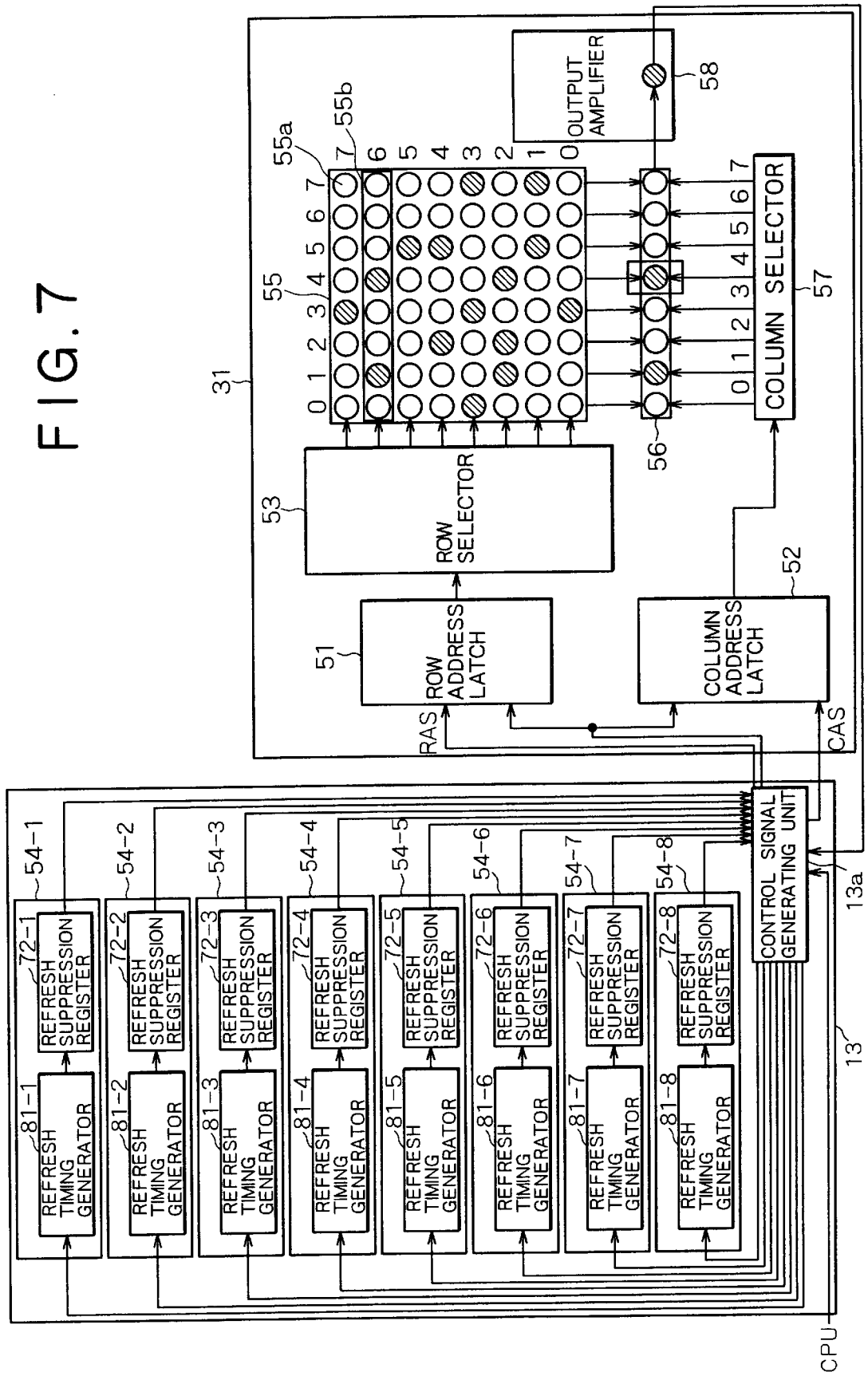

INFORMATION STORAGE APPARATUS, INFORMATION STORAGE METHOD, RECORDING MEDIUM AND PROGRAM

BACKGROUND OF THE INVENTION

In general, the present invention relates to an inform storage apparatus, an information storing method, a recording medium and a program. More particularly, the present invention relates to an information storage apparatus and an information storing method that are capable of reducing the power consumption of a DRAM (Dynamic Random Access Memory) and reading out data of the DRAM at a high speed, relates to a program implementing the information storing method and relates to a recording medium for storing the program.

The technology of the so-called DRAM has generally been becoming popular. The DRAM is a representative memory, which is used for temporarily storing a large amount of data and allows the data to be read out from it.

In accordance with a data storage principle of the DRAM comprising memory banks each having a plurality of cells each used for accumulating an electric charge in the same way as a capacitor, digital data is stored as an electric charge accumulated in each of the cells and whether data is stored in a cell is determined by whether an electric charge is accumulated in the cell. In accordance with a principle to read out data from a cell of a DRAM, an electric charge accumulated in the cell is read out from the cell and amplified. The amplified electric charge is read out as data.

By the way, an electric charge accumulated in a cell described above will be unavoidably all discharged if the cell's state of being unaccessed continues. The cell's state of being unaccessed is the cell's state in which data stored in the cell is not read out. As a result, data stored in the cell is destroyed. In order to solve this problem, electric charge stored in all cells is read out in page units at predetermined time intervals and amplified by amplifiers before being returned back to the cells in the so-called refresh processing. A page is a column of cells in a matrix in which cells of the DRAM are arranged. By carrying out the refresh processing repeatedly at predetermined time intervals, it is possible to retain data stored in the DRAM.

Since the refresh processing described above must be carried out on all cells repeatedly at predetermined time intervals, however, there is raised a problem that much power is consumed during the refresh processing.

In addition, while the refresh processing described above is being carried out, the amplifier for reading operations is in a state of electrically recharging the cell as part of the refresh processing carried out at predetermined intervals. Thus, processing to read out data from the cell cannot probably be carried out. As a result, there is raised another problem that the processing to read out data from the cell is disturbed and the processing is therefore delayed.

In order to solve the problems described above, Japanese Patent Laid-open No. Hei 9-306164 discloses a method whereby a page is subjected to refresh processing only when a timer provided for the page indicates that the page is not accessed for a period of time longer than a predetermined period. By implementing this method, a page whose data is read out during the predetermined time interval is not subjected to refresh processing. Thus, the number of states in which read processing cannot be carried out is reduced accordingly.

It is an object of both the method whereby refresh processing is carried out at predetermined intervals and the method disclosed in Japanese Patent Laid-open No. Hei 9-306164 to carry out refresh processing for all cells of the DRAM. Thus, a cell not contributing to data recording, that is, the so-called unused cell, is also subjected to the refresh processing at fixed time intervals. That is to say, a cell naturally requiring no refresh processing is also subjected to refresh processing, which causes a problem of wastefully consumed power.

SUMMARY OF THE INVENTION

It is thus an object of the present invention to reduce the power consumption of a DRAM and increase the read speed of the DRAM by reducing a period of time in which the DRAM is subjected to refresh processing.

An information storage apparatus provided by the present invention comprises:

electric charge recharging command outputting means for outputting a command to recharge accumulated electric charges into a group of cells predetermined among a plurality of cells to the group of cells at predetermined time intervals;

operating status monitoring means for monitoring operating status of the group of cells; and command suppressing means for preventing the command to recharge accumulated electric charges from being output by the electric charge recharging command outputting means to the predetermined group of cells in accordance with the operating status of the group of cells, which is monitored by the operating status monitoring means.

The group of cells has a size of at least a page of a memory bank.

If a plurality of memory banks exist, the group of cells has a size of at least a memory bank.

The operating status may include status in which data has been stored, status in which data has not been stored, status in which the group of cells has been de-allocated as a storage area and status in which the group of cells has been allocated as a storage area.

The command suppressing means may prevent the command to recharge accumulated electric charges from being output by the electric charge recharging command outputting means to the predetermined group of cells if the operating status of the group of cells, which is monitored by the operating status monitoring means, indicates that data has not been stored or the group of cells has been de-allocated as a storage area.

The information storage apparatus may further include read command outputting means for outputting a command to read out an electric charge stored in any of the cells and the electric charge recharging command outputting means outputs a command to recharge accumulated electric charges to the group of cells predetermined among the cells for a specific one of the predetermined time intervals only when the read command outputting means does not output a command to read out an electric charge stored in any cell included in the group of cells for the specific predetermined time interval.

An information storing method provided by the present invention includes:

an electric charge recharging command outputting step of outputting a command to recharge accumulated electric charges into a group of cells predetermined among a plurality of cells to the group of cells at predetermined time intervals;

operating status monitoring step of monitoring operating status of the group of cells; and a command suppressing step of preventing the command to recharge accumulated electric charges from being output at the electric charge recharging command outputting step to the predetermined group of cells in accordance with the operating status of the group of cells, which is monitored at the operating status monitoring step.

The present invention provides a recording medium for storing a program including:

an electric charge recharging command output control step of controlling an issuance of a command to recharge accumulated electric charges into a group of cells predetermined among a plurality of cells to the group of cells at predetermined time intervals;

an operating status monitoring control step of controlling a monitoring of operating status of the group of cells; and a command suppression control step of controlling a suppression of a command output in processing carried out at said electrical charge recharging command output control step to electrically recharge electric charges accumulated in said group of cells to said group of cells in accordance with said operating status of said group of cells, which is monitored in processing carried out at said operation status monitoring control step.

A program provided by the present invention executes:

an electric charge recharging command output control step of controlling an issuance of a command to recharge accumulated electric charges into a group of cells predetermined among a plurality of cells to the group of cells at predetermined time intervals;

operating status monitoring control step of controlling a monitoring of operating status of the group of cells; and a command suppression control step of controlling a suppression of a command output in processing carried out at said electrical charge recharging command output control step to electrically recharge electric charges accumulated in said group of cells to said group of cells in accordance with said operating status of said group of cells, which is monitored in processing carried out at said operation status monitoring control step.

In accordance with the information storage apparatus, the information storing method and the program, which are provided by the present invention, a command to recharge accumulated electric charges into a group of cells predetermined among a plurality of cells to the group of cells is output at predetermined time intervals, operating status of the group of cells is monitored and the command to recharge accumulated electric charges is prevented from being output to the predetermined group of cells in accordance with the monitored operating status of the group of cells.

BRIEF DESCRIPTION OF THE DRAWINGS

FIG. 6 is a flowchart referred to in explanation of memory refresh control processing; and FIG. 7 is an explanatory block diagram showing another configuration of the memory unit.

DETAILED DESCRIPTION OF THE PREFERRED EMBODIMENT

Preferred embodiments of the present invention will hereinafter be described in detail with reference to the drawings.

Figure 1:
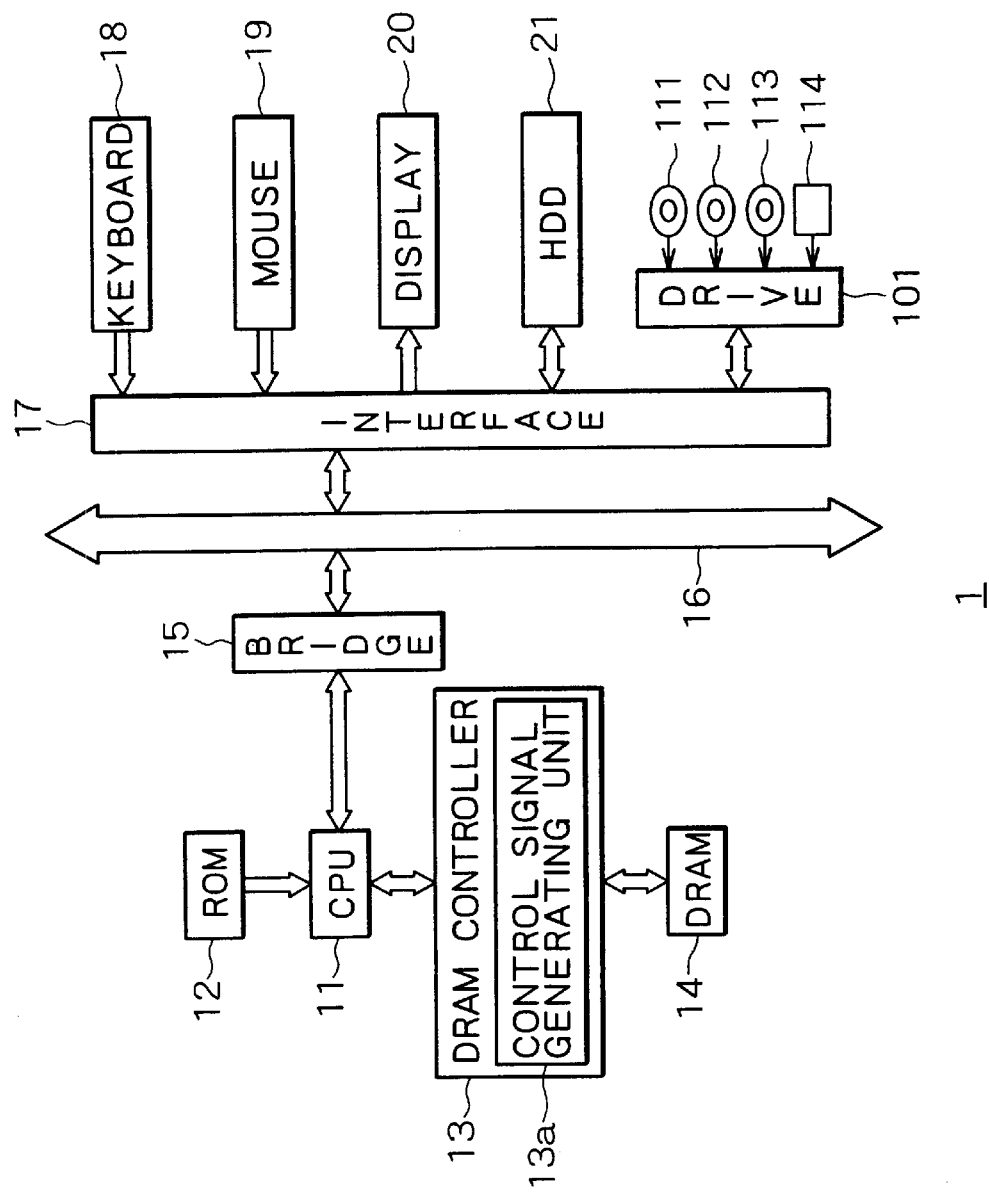
FIG. 1 is a block diagram showing the configuration of a personal computer provided by the present invention.

FIG. 1 is a block diagram showing the configuration of a personal computer 1 provided by the present invention.

A CPU (Central Processing Unit) 11 actually executes a variety of application programs and an OS (Operating System), which are stored in an HDD (Hard Disc Drive) 21. A ROM (Read Only Memory) 12 is generally used for storing a program to be executed by the CPU 11 and basically constant data among parameters required in processing. A DRAM (Dynamic Random Access Memory) controller 13 controls a DRAM 14 in accordance with a command issued by the CPU 11. To put it more concretely, a control signal generating unit 13a employed in the DRAM controller 13 generates a control signal for controlling the DRAM 14 so as to store a program to be executed by the CPU 11 and parameters appropriately changed during execution of a program in the DRAM 14. Details of the DRAM 14 will be described later. The CPU 11 is connected to the ROM 12 and the DRAM controller 13 by links such as a CPU bus not shown in the figure. In addition, the CPU 11, the ROM 12 and the DRAM 14 are connected to a host bus not shown in the figure. The host bus is connected to an external bus 16 such as a PCI (Peripheral Component Interconnect/Interface) bus by a bridge 15.

The keyboard 18 is operated by the user for entering a variety of commands to the CPU 11. A mouse 19 is operated by the user for indicating and selecting a point on the screen of a display unit 20. The display unit 20 is either of an LCD (Liquid Crystal Display) unit and a CRT (Cathode Ray Tube) display unit, which are used for displaying various kinds of information as a text and/or an image. An HDD 21 drives a hard disc, storing or reproducing a program to be executed by the CPU 11 onto or from the hard disc.

A drive 101 reads out data or a program from one of a magnetic disc 111, an optical disc 112, a magneto optical disc 113 and a semiconductor memory 114, which are mounted on the drive 101. The drive 101 then supplies the data or the program to the DRAM 14 by way of an interface 17, the external bus 16, the bridge 15, the CPU 11 and the DRAM controller 13.

The components ranging from the keyboard 18 to the HDD 21 are connected to the interface 17, which is connected to the CPU 11 by the interface 17, the external bus 16, the bridge 15 and the host bus.

Figure 2:
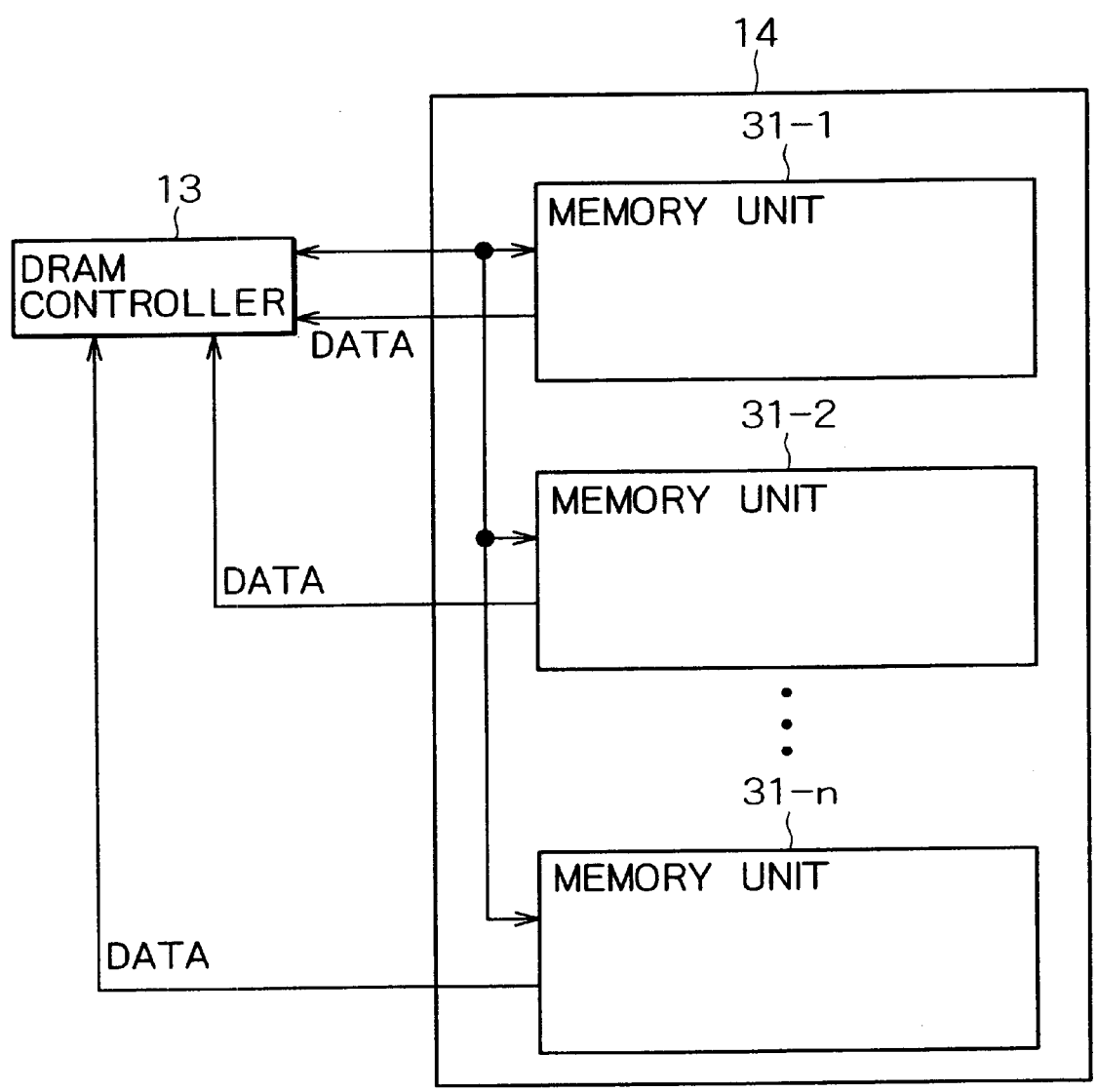
FIG. 2 is an explanatory block diagram showing the configuration of a DRAM employed in the personal computer shown in FIG. 1.

Next, the configuration of the DRAM 14 is explained by referring to FIG. 2.

The DRAM 14 comprises memory units 31-1 to 31-$n$, where n is typically but not necessarily 8. In accordance with an address signal, a RAS (Row Address Strobe) signal and a CAS (Column Address Strobe) signal, which are generated by the control signal generating unit 13a on the basis of information on an address specified by the CPU 11, data is stored in the DRAM 14 or data is read out from the DRAM 14 to be supplied to the CPU 11 by way of the DRAM controller 13. It should be noted that, in the following description, a generic reference numeral of 31 is used to denote a memory unit 31-$j$ where j=1 to n if there is no need to distinguish the memory units 31-1 to 31-n from each other. The notion of such a generic reference numeral holds true of other components.

Figure 3:
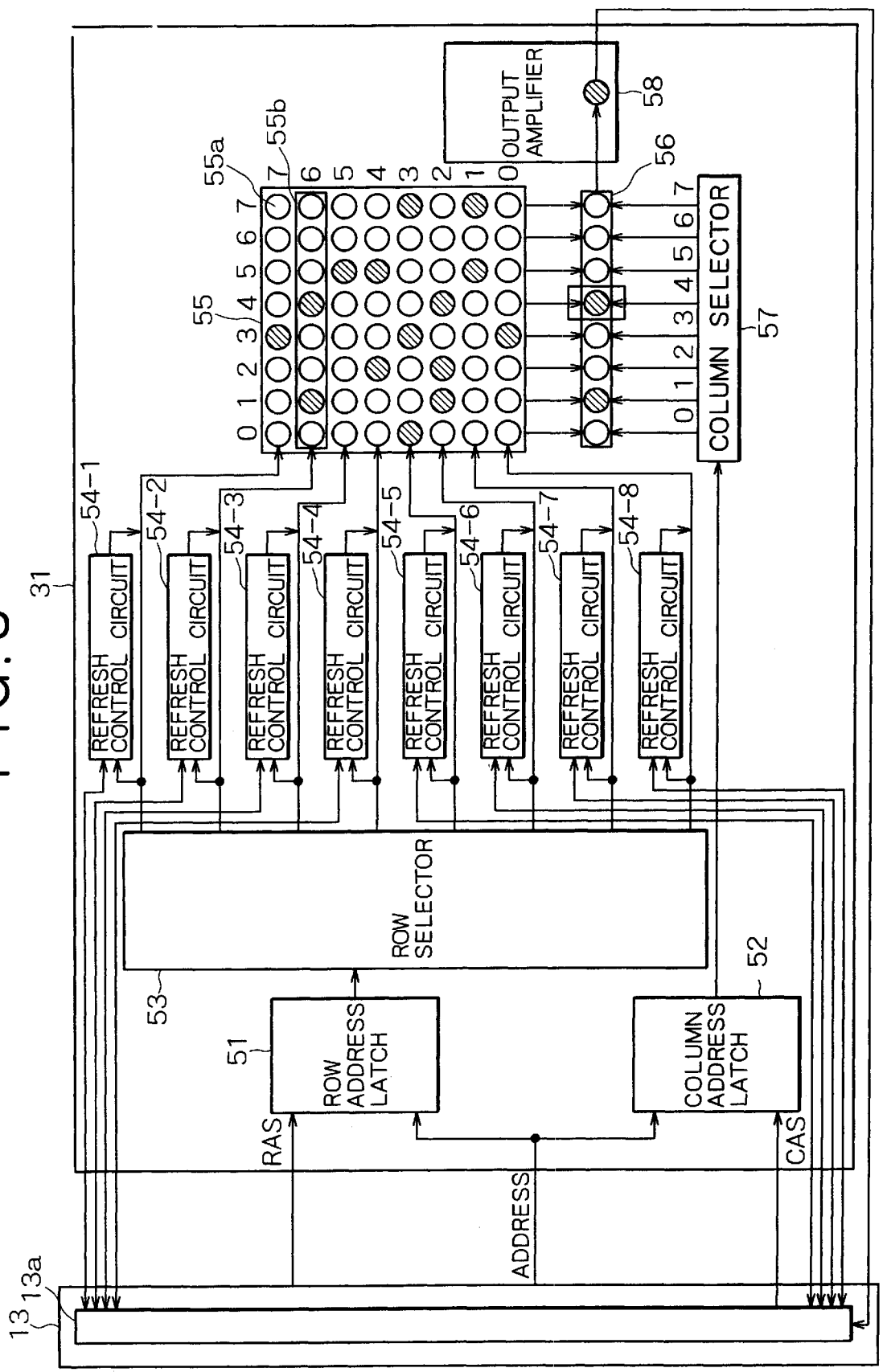
FIG. 3 is an explanatory block diagram showing a configuration of a memory unit employed in the DRAM shown in FIG. 2.

Next, the configuration of the memory unit 31 is explained by referring to FIG. 3.

When receiving a RAS signal from the control signal generating unit 13a employed in the DRAM controller 13, a row address latch 51 turns on its operating status and outputs row information of an address indicating the location of a cell 55a in a memory bank 55 to be described later to a row selector 53. The row selector 53 outputs a read signal to a predetermined page 55b on the memory bank 55. The predetermined page 55b corresponds to the row input from the row address latch 51.

Figure 4:
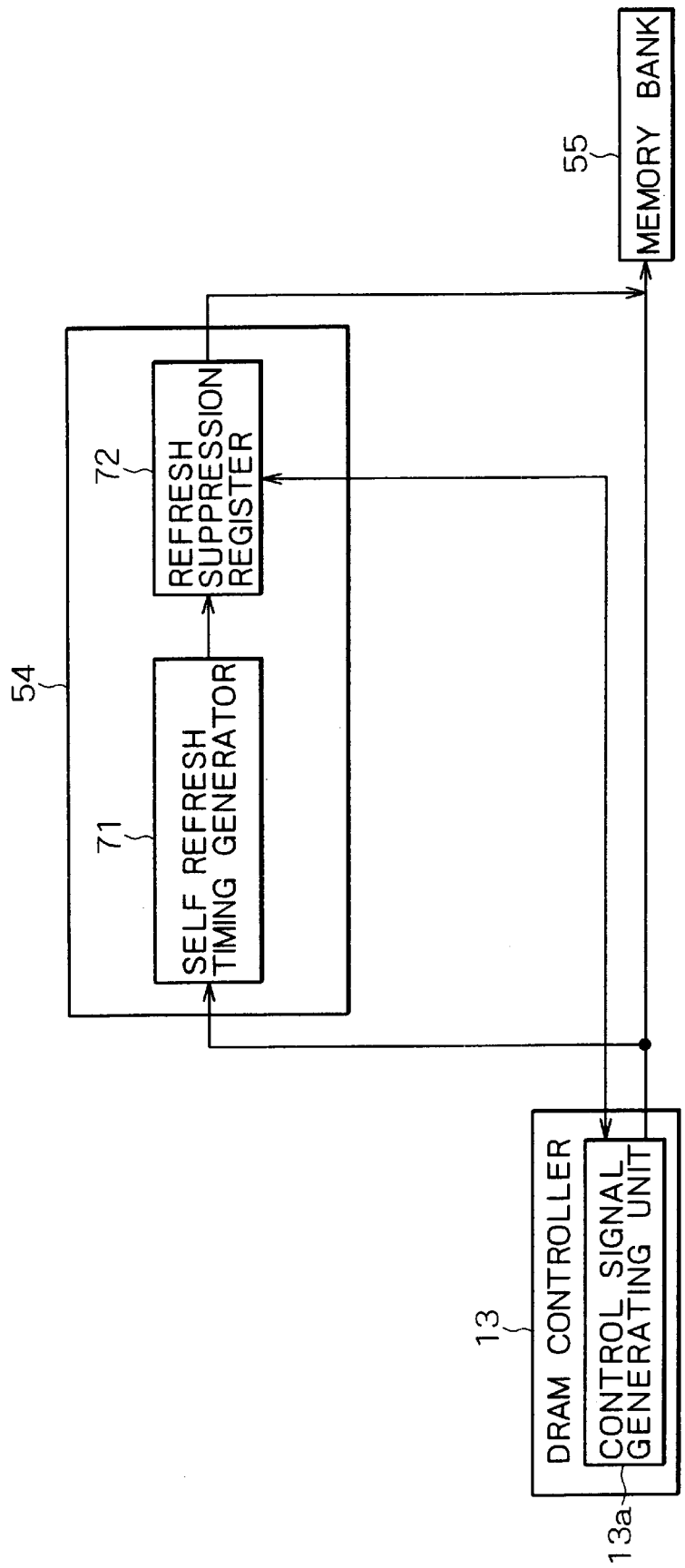
FIG. 4 is an explanatory block diagram showing the configuration of a refresh control circuit employed in the memory unit shown in FIG. 3.

Refresh control circuits 54-1 to 54-8 are each provided for a signal line originating from the DRAM controller 13 for a page 55b of the memory bank 55. The refresh control circuit 54 has a self refresh timing generator 71 and a refresh suppression register 72 as shown in FIG. 4.

On the basis of a reference signal input from the CPU 11 through the control signal generating unit 13a employed in the DRAM controller 13, the self refresh timing generator 71 outputs a refresh signal to the refresh suppression register 72. The refresh signal indicates a timing with which self refresh processing is carried out on the page 55b associated with the refresh control circuit 54 including the self refresh timing generator 71 only when a read signal is not generated by the row selector 53 during a predetermined time interval. The refresh suppression register 72 is a register for storing information indicating whether or not refresh processing is suppressed by the control signal generating unit 13a employed in the DRAM controller 13. To put it in more detail, the control signal generating unit 13a employed in the DRAM controller 13 issues a read signal to a page 55b and monitors the operating status of the page 55b. The status may indicate that no data is stored on the page 55b included in the memory bank 55 provided at the following stage or the page 55b has been de-allocated as a storage area. In this case, the refresh suppression register 72 is turned on to suppress refresh processing and a refresh signal generated by the self refresh timing generator 71 is not output to the page 55b associated with the refresh control circuit 54 including the self refresh timing generator 71. The refresh signal indicates a timing with which self refresh processing is carried out on the cells 55a of the page 55b. On the other hand, the status may indicate that data is stored on a page 55b included in the memory bank 55 provided at the following stage or the page 55b has been allocated as a storage area. In this case, the refresh suppression register 72 is turned off to carry out refresh processing and a refresh signal generated by the self refresh timing generator 71 is output to the page 55b associated with the refresh control circuit 54 including the self refresh timing generator 71. The refresh signal indicates a timing with which self refresh processing is carried out on the cells 55a of the page 55b.

The memory bank 55 comprises a plurality of pages 55b each having a plurality of cells 55a each used for storing a piece of data. Each of the cells 55a has the same configuration as a capacitor. An electric charge stored in a cell 55a corresponds to data stored in the cell 55a. On the other hand, an electric charge discharged from a cell 55a corresponds to no data stored in the cell 55a. In this example, cells 55a in a memory bank 55 are arranged to form an 8×8 cell matrix. However, the number of cells 55a in a memory bank 55 can of course be changed. A page 55b is a row of cells 55a in the matrix of the memory bank 55. When a refresh signal is supplied to a page 55b of the memory bank 55 by the self refresh timing generator 71 employed in a refresh control circuit 54 associated with the page 55b or when a read signal is supplied to the page 55b from the row selector 53, electric charges stored in the cells 55a of the page 55b associated with the row inputted the read signal are transferred to a sense amplifier 56. It should be noted that, in FIG. 3, numbers 0 to 7 arranged horizontally above the memory bank 55 are each the number of a vertical column of cells 55a in the memory bank 55. On the other hand, numbers 0 to 7 arranged vertically on the right side of the memory bank 55 are each the number of a horizontal row of cells 55a in the memory bank 55.

When electric charges are transferred from cells 55a of a page 55b specified by the row selector 53 are transferred to the sense amplifier 56, the sense amplifier 56 amplifies signals representing the transferred electric charges to a predetermined electric potential and returns the signals back to the cells 55a of the page 55b. At that time, with electric charges newly accumulated, if a read signal for a column specified by a column selector 57 is supplied to the sense amplifier 56, the sense amplifier 56 reads out data of the specified column and outputs the data to an output amplifier 58.

It should be noted that the sense amplifier 56 shown in the figure has a configuration capable of amplifying only electric charges stored in cells 55a of any page 55b. Thus, either refresh processing or a read operation can be carried out on 1 page only. For this reason, a refresh signal generated by the self refresh timing generator 71 or a read signal generated by the row selector 53 are controlled by the CPU 11 so as to produce a timing with which the refresh processing or the read operation is carried out on a desired page 55b. In addition, a plurality of sense amplifiers 56 can be provided so that refresh processing or a read operation can be carried out at the same time on the same plurality of pages 55b.

When receiving a CAS signal from the DRAM controller 13, a column address latch 52 turns on its operating status and outputs column information of an address indicating the location of a cell 55a in the memory bank 55 to the column selector 57. The column selector 57 outputs a signal to read out a piece of data from a column of the sense amplifier 56 to the sense amplifier 56 and requests the sense amplifier 56 to supply the data to the output amplifier 58. The column is indicated by the column information received from the column address latch 52. The output amplifier 58 further amplifies a signal representing the received data and outputs the data to the CPU 11 by way of the DRAM controller 13.

The following description explains an operation carried out by the DRAM controller 13 to read out data from a cell 55a on the memory bank 55 in accordance with a command issued by the CPU 11. Assume for example that the DRAM controller 13 makes an attempt to read out data from a cell 55a on the $6^{th}$ row and the $4^{th}$ column of the memory bank 55 in the DRAM 14 in accordance with a command issued by the CPU 11. In this case, the CPU 11 issues a command to the DRAM controller 13 to read out data from the cell 55a on the $6^{th}$ row and the $4^{th}$ column. When receiving this command, the control signal generating unit 13a employed in the DRAM controller 13 outputs a RAS signal to the row address latch 51 and then outputs a signal of the corresponding address to the row address latch 51 and the column address latch 52. When receiving the RAS signal from the control signal generating unit 13a, the row address latch 51 turns on its operating status and subsequently outputs row information included in address information to the row selector 53. Thus, in this specific read operation, information indicating the $6^{th}$ row is output to the row selector 53.

The row selector 53 outputs a read signal to the sense amplifier 56 to request the sense amplifier 56 to transfer an electric charge from cells 55a of a page 55b indicated by the row information received from the row address latch 51 to the sense amplifier 56. Thus, electric charges are transferred from the cells 55a of a sixth page 55b enclosed by a solid line in the memory bank 55 to the sense amplifier 56. The sense amplifier 56 amplifies the electric charge quantities of the transferred electric charges to a predetermined value.

At that time, the control signal generating unit 13a outputs a CAS signal to the column address latch 52 and then outputs a signal of the corresponding address to the row address latch 51 and the column address latch 52. When receiving the CAS signal from the control signal generating unit 13a, the column address latch 52 turns on its operating status and subsequently outputs column information included in address information to the column selector 57. Thus, in this specific read operation, information indicating the $4^{th}$ column is output to the column selector 57.

The column selector 57 outputs a read signal to the sense amplifier 56 to request the sense amplifier 56 to transfer an electric charge amplified by the sense amplifier 56 from a column indicated by the column information to the output amplifier 58. In this case, in accordance with this read signal, the sense amplifier 56 transfers an electric charge of a cell 55a in the fourth column enclosed by a solid line in the figure to the output amplifier 58. The output amplifier 58 amplifies the electric charge quantity of the transferred electric charge to a predetermined required value before supplying the amplified electric charge to the CPU 11 as data by way of the DRAM controller 13. It should be noted that, later on, the sense amplifier 56 returns the amplified electric charges of the $6^{th}$ page 55b back to their original cells 55a in the memory bank 55. Thus, the eight cells 55a on the $6^{th}$ page 55b completing a read operation are each restored to its original state of holding an electric charge with an electric charge quantity, that is, an electrically charged state.

By carrying out the operation as described above, data specified by the CPU 11 can be read out from a cell 55a in the memory unit 31 employed in the DRAM 14.

Figure 5:
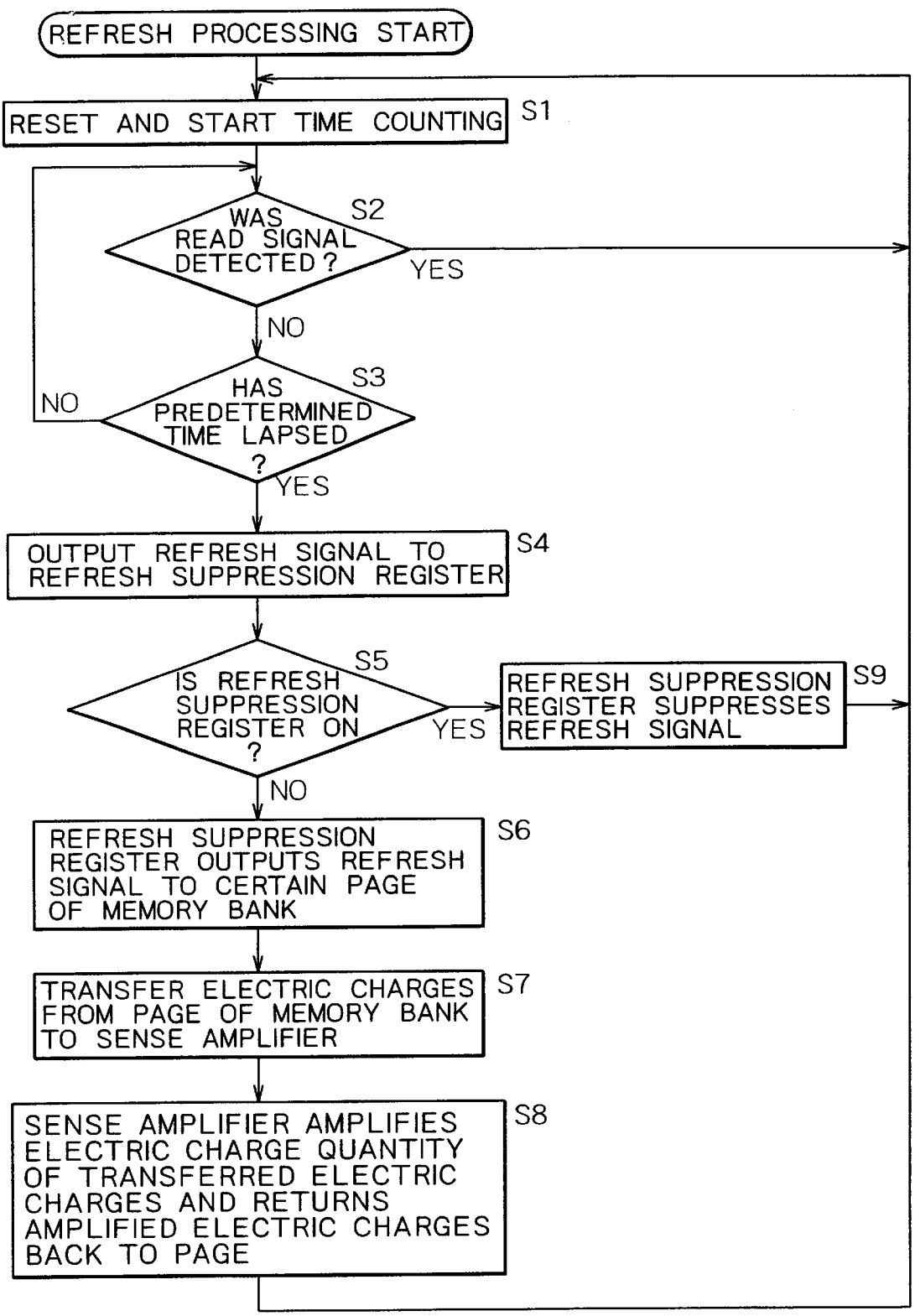
FIG. 5 is a flowchart referred to in explanation of memory refresh processing.

Next, the refresh processing is explained by referring to a flowchart shown in FIG. 5.

As shown in the figure, the flowchart begins with a step Si at which the self refresh timing generator 71 resets a time count to start a measurement of the lapse of time. Then, at the next step S2, the self refresh timing generator 71 forms a judgment as to whether or not a read signal has been detected. If a read signal has been detected, the flow of the processing goes back to the step S1 to repeat the processing to reset the time count and start the measurement of the lapse of time.

If the outcome of the judgment formed at the step S2 indicates that no read signal has been detected, on the other hand, the flow of the processing goes on to a step S3. That is, if no read signal is detected during a period of time since the step SI to start the measurement of the lapse of time, data stored in the cells 55a of the page 55b associated with the self refresh timing generator 71 stays in a state of never being read out by the sense amplifier 56. At the step S3, the period of time is examined by the self refresh timing generator 71 to form a judgment as to whether or not the period time has exceeded a predetermined period of time. If the period time has not exceeded the predetermined period of time at the step S3, the flow of the processing goes back to the step S2 to repeat the formation of the judgments at the steps S2 and S3 till a read signal is detected or the period time exceeds the predetermined period of time. If the outcome of the judgment formed at the step S3 indicates that the period time has exceeded the predetermined period of time, the flow of the processing goes on to a step S4. It should be noted that the formation of the judgment at the step S2 can be eliminated. In this case, if the lapse of time exceeds the predetermined period of time, the flow of the processing goes on to the step S4 without regard to whether a read operation is carried out.

At the step S4, the self refresh timing generator 71 generates a refresh signal and outputs the signal to the refresh suppression register 72. Then, at the next step S5, the refresh suppression register 72 forms a judgment as to whether or not its operating status is on. If the outcome of the judgment indicates that its operating status is not on or the status is off, that is, if the refresh signal is in a state of being unsuppressed, the flow of the processing goes on to a step S6 at which the refresh suppression register 72 outputs the received refresh signal to the page 55b associated with the refresh suppression register 72.

Then, at the next step S7, the cells 55a of the page 55b receiving the refresh signal transfer their electric charges to the sense amplifier 56. Subsequently, at the next step S8, the sense amplifier 56 amplifies the electric charge quantities of the transferred electric charges to a predetermined value and returns the amplified electric charges to the cells 55a of the same page 55b. Then, the flow of the processing goes back to the step S1 to repeat the processing at the step and the subsequent steps.

If the outcome of the judgment formed at the step S5 indicates that the operating status of the refresh suppression register 72 is on, that is, if the refresh signal is in a state of being suppressed, on the other hand, the flow of the processing goes on to a step S9 at which an input refresh signal is suppressed or not output to the page 55b associated with the refresh suppression register 72. Then, the flow of the processing goes back to the step S1 to repeat the processing at the step and the subsequent steps.

As described above, normally, when a state of not detecting a read signal has been continuing for a predetermined time, the self refresh timing generator 71 generates a refresh signal at predetermined time intervals and outputs the refresh signal to an associated page 55b in the memory bank 55 to carry out refresh processing without being suppressed by the refresh suppression register 72. If the refresh suppression register 72 is set in the on status in advance, however, the refresh signal is not output to the memory bank 55 so that no refresh processing is carried out. Thus, the refresh suppression register 72 is set in the on status in advance for an unused page 55b or a page 55b de-allocated as a storage area so that no refresh processing is carried out for such a page to reduce power consumption accordingly. In addition, since unnecessary refresh processing is not carried out, the number of obstructions to read processing or accesses made by the CPU 11 can be reduced to increase the speed of processing.

By referring to a flowchart shown in FIG. 6, the following description explains processing to control operations to set the refresh suppression register 72 in the on or off status.

As shown in the figure, the flowchart begins with a step S21 at which the control signal generating unit 13a employed in the DRAM controller 13 sets all the refresh suppression registers 72 in the off status. In this off status, when a state of not detecting a read signal has been continuing for a predetermined time, refresh signals are generated and output at predetermined time intervals to all pages 55b in the memory bank 55 to carry out refresh processing without being suppressed by the refresh suppression registers 72.

Then, at the next step S22, the control signal generating unit 13a forms a judgment as to whether or not there is a page 55b not used in the memory bank 55 or a page 55b not contributing to data storage. If there is no such page 55b or if all pages 55b are used, the flow of the processing goes on to a step S23.

At the step S23, the control signal generating unit 13a forms a judgment as to whether or not a command to de-allocate a page 55b as a storage area has been received from the CPU 11. If the outcome of the judgment indicates that such a command has not been received, the flow of the processing goes on to a step S24.

At the step S24, the control signal generating unit 13a forms a judgment as to whether or not a command to allocate a page 55b as a storage area has been received from the CPU 11. If the outcome of the judgment indicates that such a command has not been received, the flow of the processing goes back to the step S22.

If the outcome of the judgment formed at the step S22 indicates that there is a page 55b not used in the memory bank 55, on the other hand, the flow of the processing goes on to a step S25 to set the refresh suppression register 72 employed in the refresh control circuit 54 associated with the unused page 55b in on status. Then, the flow of the processing goes back to the step S22. Assume for example that the judgment formed at the step S22 indicates that a $6^{th}$ page 55b enclosed by a solid line as shown in FIG. 7 is not used in the memory bank 55. In this case, the control signal generating unit 13a sets the refresh suppression register 72 employed in the refresh control circuit 54-2 associated with the unused page 55b enclosed by the solid line in on status, disabling the refresh processing.

If the outcome of the judgment formed at the step S23 indicates that a command to de-allocate a page 55b as a storage area has been received from the CPU 11, that is, if the command discards information stored in the page 55b used so far or the command discharges electric charges from the cells 55a of the page 55b, on the other hand, the flow of the processing goes on to the step S25.

If the outcome of the judgment formed at the step S24 indicates that a command to allocate a page 55b as a storage area has been received from the CPU 11, on the other hand, the flow of the processing goes on to a step S26 to set the refresh suppression register 72 employed in the refresh control circuit 54 associated with the unused page 55b in off status. Then, the flow of the processing goes back to the step S22. Assume for example that the judgment formed at the step S24 of FIG. 6 indicates that there has been received a command to allocate a $6^{th}$ page 55b enclosed by a solid line as shown in FIG. 7 as a storage area in the memory bank 55. In this case, the control signal generating unit 13a sets the refresh suppression register 72 employed in the refresh control circuit 54-2 associated with the unused page 55b enclosed by a solid line in off status, enabling the refresh processing.

As described above, cells 55a of an unused page 55b in the memory bank 55 or a page 55a de-allocated by a command as a storage area in the memory bank 55 do not contribute to data storage. Thus, it is not necessary to carry out refresh processing to sustain electric charges accumulated in the cells 55a to represent stored data. For this reason, the refresh suppression register 72 is set in an on status to establish a state in which no refresh processing is carried out on a page 55b associated with the refresh suppression register 72 in order to reduce power consumption. In addition, when it is necessary to allocate a page 55b as a storage area, the refresh suppression register 72 is set in an off status to establish a state in which refresh processing is carried out at predetermined time intervals on a page 55b associated with the refresh suppression register 72 so that electric charges accumulated as stored data are sustained in the cells 55a of the page 55b.

In the above description, the refresh control circuit 54 is provided in the memory unit 31 of the DRAM 14. However, the refresh control circuit 54 can also be provided in the DRAM controller 13 as shown in FIG. 7.

A refresh timing generator 81 carries out exactly the same operation as the self refresh timing generator 71. In addition, the refresh suppression registers 72 are each connected to the control signal generating unit 13a by a signal line not shown in the figure. The signal line is used to set the refresh suppression register 72 in an on or off status. In addition, when the control signal generating unit 13a supplies a CAS signal, a RAS signal and an address signal causing a read signal to be generated to the row address latch 51 and the column address latch 52, at the same time, the control signal generating unit 13a also supplies the generated read signal to a refresh timing generator 81 indicated by a supplied address. The refresh timing generator 81 monitors an arrival of a read signal in a predetermined period of time. If no read signal is detected during the predetermined period of time, the refresh timing generator 81 outputs a refresh signal to the refresh suppression register 72. If the refresh suppression register 72 is in the on status, the refresh suppression register 72 blocks the refresh signal. If the refresh suppression register 72 is in the off status, on the other hand, the refresh suppression register 72 passes on the refresh signal to the control signal generating unit 13a. When receiving the refresh signal, the control signal generating unit 13a outputs a signal to carry out refresh processing on the page 55b associated with the refresh suppression register 72 passing on the refresh signal to the row selector 53. In this way, the refresh processing described above is carried out. To put it more concretely, a read signal is output to the row address latch 51 but not output to the column address latch 52. Thus, electric charges transferred from the cells 55a of the page 55b to the sense amplifier 56 are amplified to a predetermined electric charge quantity before being returned back to the cells 55a of the page 55b without being transferred to the output amplifier 58. As a result, refresh processing is carried out on the cells 55a of the page 55b.

By providing such a configuration, it is possible to reduce power consumption even for a DRAM 14 with no conventional refresh control circuit.

In the embodiment described above, the refresh suppression register 72 controlled to on or off status is provided for each page 55b, which corresponds to a row of the matrix of cells 55a in the memory bank 55. However, the refresh suppression register 72 controlled to on or off status can also be provided for each cell group different from a row of the matrix of cells 55a in the memory bank 55. Such a cell group is set to comprise a plurality of cells 55a. As an alternative, the refresh suppression register 72 controlled to on or off status can also be provided for each plurality of pages 55b as well. As another alternative, it is also possible to provide a configuration in which the refresh control circuit 54 including the refresh suppression register 72 is provided for each memory bank 55 so that the refresh processing is controlled to on or off status for each memory bank 55.

In the above description, the DRAM 14 is used by the CPU 11 employed in a personal computer 1. However, the description also holds true of any apparatus other than the personal computer 1 as long as the apparatus utilizes the DRAM 14. Examples of the other apparatus are a portable terminal and a printer.

As described above, the refresh suppression register 72 associated with a page 55b not contributing to data storage in the memory bank 55 is controlled so that no refresh processing is carried out on the page 55b. In this way, the number of refresh signals generated by the self refresh timing generator 71 or the refresh timing generator 81 can be reduced to a required minimum so that the amount of power consumed during refresh processing can also be decreased as well. In addition, a delay of an operation to read data from cells 55a in the memory bank 55 caused by refresh processing can be suppressed. As a result, a high speed read operation can be implemented with a high degree of probability.

The processing sequence described above can be implemented by hardware or software. If the sequential processing is implemented by software, programs composing the software are installed from a network or a recording medium in a computer including embedded dedicated hardware or another computer such as a general purpose personal computer capable of carrying out a variety of functions by execution of a variety of programs installed in the personal computer.

As show in FIG. 1, the recording medium for recording programs to be installed in the personal computer 1 can be a package medium in addition to the HDD 21, which is incorporated in the personal computer 1 in advance for storing the programs presented to the user. The package media can be the magnetic disc 111 including a flexible disc, the optical disc 112 including a CD-ROM (Compact Disc Read Only Memory) and a DVD (Digital Versatile Disc), the magneto optical disc 113 including an MD (Mini Disc), which is a registered trademark, or the semiconductor memory 114 including Memory Stick. The package medium is distributed to users to present the programs recorded therein to the users.

It should be noted that, in this specification, steps composing a program recorded in a recording medium include mainly pieces of processing to be executed sequentially in accordance with a predetermined order along the time axis. However, the steps are not necessarily the pieces of processing to be executed sequentially. Instead, the steps may include pieces of processing to be executed concurrently or individually.

In accordance with an information storage apparatus, an information storing method and a program, which are provided by the present invention, a command to electrically recharge accumulated electric charges into a group of cells determined among a plurality of cells is given to the group of cells, operating status of the group of cells is monitored and, in accordance with the monitored operating status of the group of cells, the issuance of the command to electrically recharge accumulated electric charges into the group of cells to the group of cells is suppressed. Thus, the power consumption for refresh processing is reduced and, in addition, a read operation's delay that would be incurred due to the refresh processing can be suppressed. As a result, a high speed read operation can be implemented with a high degree of probability.

What is claimed is:

1. An information storage apparatus composed of one or more memory banks each including a plurality of cells and used for storing data by electrically charging electrical charges into said cells, said information storage apparatus comprising:

electrical charge recharging command outputting means for issuing a command to electrically recharge electric charges accumulated in a group of cells predetermined among said cells to said group of cells at predetermined intervals;

operation status monitoring means for monitoring operation status of said group of cells; and command suppressing means for suppressing a command output by said electrical charge recharging command outputting means to electrically recharge electric charges accumulated in said group of cells to said group of cells in accordance with said operating status of said group of cells, which is monitored by said operation status monitoring means.

2. An information storage apparatus according to claim 1 wherein said group of cells has a size of at least a page of said memory bank.

3. An information storage apparatus according to claim 1 wherein, if said information storage apparatus comprises a plurality of said memory banks, said group of cells has a size of at least a memory bank.

4. An information storage apparatus according to claim 1 wherein said command suppressing means does not suppress said command output by said electrical charge recharging command outputting means to electrically recharge electric charges accumulated in said group of cells to said group of cells if said group of cells is in a state of being allocated as a storage area.

5. An information storage apparatus according to claim 1 wherein said command suppressing means suppresses said command output by said electrical charge recharging command outputting means to electrically recharge electric charges accumulated in said group of cells to said group of cells if said operating status of said group of cells, which is monitored by said operation status monitoring means, indicates that said group of cells is in a state of storing no electrical charges.

6. An information storage apparatus according to claim 1, said information storage apparatus further comprising read command outputting means for issuing a read command to read out electrical charges accumulated in said cells wherein, if no read command is output by said read command outputting means within a predetermined period of time, said electrical charge recharging command outputting means issues a command to electrically recharge electric charges accumulated in a group of cells predetermined among said cells to said group of cells.

7. An information storage apparatus according to claim 1, said information storage apparatus further comprising read command outputting means for issuing a read command to read out electrical charges accumulated in said cells wherein, if a read command is output by said read command outputting means, said electrical charge recharging command outputting means detects the read command and resets a timing count used for determining a timing with which a command to electrically recharge electric charges accumulated in a group of cells predetermined among said cells is output to said group of cells.

8. An information storage apparatus composed of one or more memory banks each including a plurality of cells and used for storing data by electrically charging electrical charges into said cells, said information storage apparatus comprising:

an electrical charge recharging command outputting unit, which is used for issuing a command to electrically recharge electric charges accumulated in a group of cells predetermined among said cells to said group of cells if no read signal is output during a predetermined period of time;

an operation status monitoring unit for monitoring operation status of said group of cells; and a switching command suppressing unit for forming a judgment as to whether or not to suppress said command output by said electrical charge recharging command outputting unit to electrically recharge electric charges accumulated in said group of cells to said group of cells in accordance with said operating status of said group of cells, which is monitored by said operation status monitoring unit.

9. An information storage apparatus according to claim 8 wherein said command suppressing unit does not suppress said command output by said electrical charge recharging command outputting unit to electrically recharge electric charges accumulated in said group of cells to said group of cells if said group of cells is in a state of being allocated as a storage area.

10. A memory unit, which has a memory bank including a plurality of cells and is used for storing data by electrically charging electrical charges into said cells, said memory unit comprising:

an electrical charge recharging command outputting circuit for issuing a command to electrically recharge electric charges accumulated in a group of cells predetermined among said cells to said group of cells at predetermined intervals; and a switching command suppressing circuit for forming a judgment as to whether or not to suppress said command output by said electrical charge recharging command outputting circuit to electrically recharge electric charges accumulated in said group of cells to said group of cells in accordance with a signal generated to represent operating status of said group of cells.

11. A memory unit according to claim 10 wherein, if said electrical charge recharging command outputting circuit detects a read command to read out data from said cells, said electrical charge recharging command outputting circuit resets a timing count used for determining a timing with which said command to electrically recharge electric charges accumulated in said group of cells is output to said group of cells.

12. An information storing method adopted in an information storage apparatus composed of one or more memory banks each including a plurality of cells and used for storing data by electrically charging electrical charges into said cells, said information storing method comprising:

an electrical charge recharging command outputting step of issuing a command to electrically recharge electric charges accumulated in a group of cells predetermined among said cells to said group of cells at predetermined intervals;

an operation status monitoring step of monitoring operation status of said group of cells; and a command suppressing step of suppressing a command output in processing carried out at said electrical charge recharging command outputting step to electrically recharge electric charges accumulated in said group of cells to said group of cells in accordance with said operating status of said group of cells, which is monitored in processing carried out at said operation status monitoring step.

13. A storage medium for storing a computer readable program for controlling an information storage apparatus composed of one or more memory banks each including a plurality of cells and used for storing data by electrically charging electrical charges into said cells wherein said computer readable program comprises:

an electrical charge recharging command output control step of controlling an issuance of a command to electrically recharge electric charges accumulated in a group of cells predetermined among said cells to said group of cells at predetermined intervals;

an operation status monitoring control step of controlling a monitoring of operation status of said group of cells; and a command suppression control step of controlling suppression of a command output in processing carried out at said electrical charge recharging command output control step to electrically recharge electric charges accumulated in said group of cells to said group of cells in accordance with said operating status of said group of cells, which is monitored in processing carried out at said operation status monitoring control step.

14. A program to be executed by a computer for controlling an information storage apparatus composed of one or more memory banks each including a plurality of cells and used for storing data by electrically charging electrical charges into said cells, said program comprising:

an electrical charge recharging command output control step of controlling an issuance of a command to electrically recharge electric charges accumulated in a group of cells predetermined among said cells to said group of cells at predetermined intervals;

an operation status monitoring control step of controlling a monitoring of operation status of said group of cells; and a command suppression control step of controlling suppression of a command output in processing carried out at said electrical charge recharging command output control step to electrically recharge electric charges accumulated in said group of cells to said group of cells in accordance with said operating status of said group of cells, which is monitored in processing carried out at said operation status monitoring control step.

* * * * *

UNITED STATES PATENT AND TRADEMARK OFFICE
CERTIFICATE OF CORRECTION

PATENT NO. : 6,594,189 B2
DATED : July 15, 2003
INVENTOR(S) : Takeshi Shimoyama

It is certified that error appears in the above-identified patent and that said Letters Patent is hereby corrected as shown below:

<u>Title page,</u>
Item [57], ABSTRACT,
Line 10, after "been" delete "set in".

<u>Column 1,</u>
Line 7, change "inform" to -- information --.

<u>Column 7,</u>
Line 57, change "SI" to -- S1 --.

Signed and Sealed this

Thirteenth Day of January, 2004

JON W. DUDAS
*Acting Director of the United States Patent and Trademark Office*